United States Patent [19]

Guyot

[11] Patent Number: 4,948,978
[45] Date of Patent: Aug. 14, 1990

[54] IMAGING DEVICE WITH MATRIX STRUCTURE

[75] Inventor: Lucien Guyot, Paris, France
[73] Assignee: Thomson-CSF, Paris, France
[21] Appl. No.: 318,165
[22] Filed: Mar. 2, 1989

[30] Foreign Application Priority Data

Mar. 11, 1988 [FR] France ............................. 88 03227

[51] Int. Cl.$^5$ ..................... G01N 23/02; G01T 1/20
[52] U.S. Cl. ............................. 250/370.11; 250/367; 250/368; 357/32
[58] Field of Search ................ 250/370.11, 370.08, 250/370.09, 367, 368; 357/32

[56] References Cited

U.S. PATENT DOCUMENTS

| | | |
|---|---|---|
| 3,963,926 | 6/1976 | Borrello . |
| 4,514,632 | 4/1985 | Barrett .............................. 250/368 |
| 4,560,882 | 10/1985 | Barbaric . |

FOREIGN PATENT DOCUMENTS

| | | |
|---|---|---|
| 68456 | 1/1983 | European Pat. Off. . |
| 3141755 | 10/1981 | Fed. Rep. of Germany . |
| 2468999 | 5/1981 | France . |
| 2593343 | 7/1987 | France . |
| 56-128475 | 10/1981 | Japan . |
| 58-216973 | 12/1983 | Japan . |
| 0084476 | 5/1984 | Japan ................................. 357/32 |
| 59-122988 | 7/1984 | Japan . |
| 59-150358 | 8/1984 | Japan . |
| 60-42671 | 3/1985 | Japan . |
| 60-58574 | 4/1985 | Japan . |
| 60-86480 | 5/1985 | Japan . |
| 62-63880 | 9/1985 | Japan . |
| 61-110079 | 5/1986 | Japan . |
| 2143373 | 2/1985 | United Kingdom . |

Primary Examiner—Janice A. Howell
Assistant Examiner—Richard Hanig
Attorney, Agent, or Firm—Roland Plottel

[57] ABSTRACT

Disclosed is an imaging device of the type which, notably, associates a scintillator screen and a matrix of photosensitive elements. The invention particularly concerns means which can be used to reduce an active surface of a photosensitive element to a far greater extent than the quantity of light to which this photosensitive element is exposed. To this end, the scintillator has an input screen and an output screen, respectively applied to an input face and an output face of the scintillator, the output screen being provided with apertures that let through a light emitted by the scintillator, the apertures being placed in a matrix arrangement and indexed on the network of photosensitive elements.

14 Claims, 3 Drawing Sheets

FIG_1

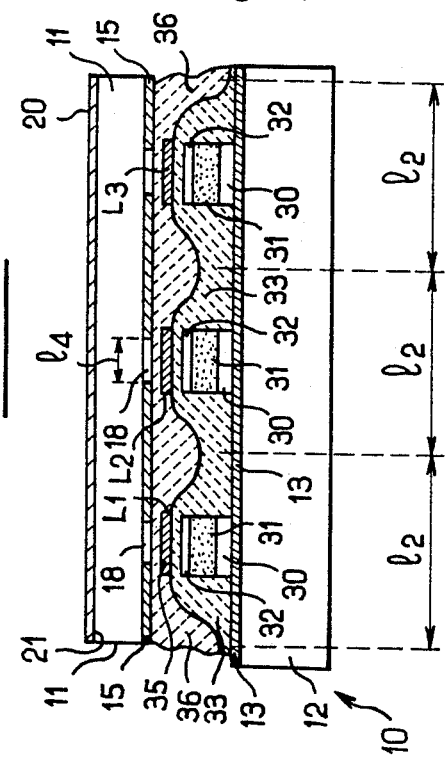
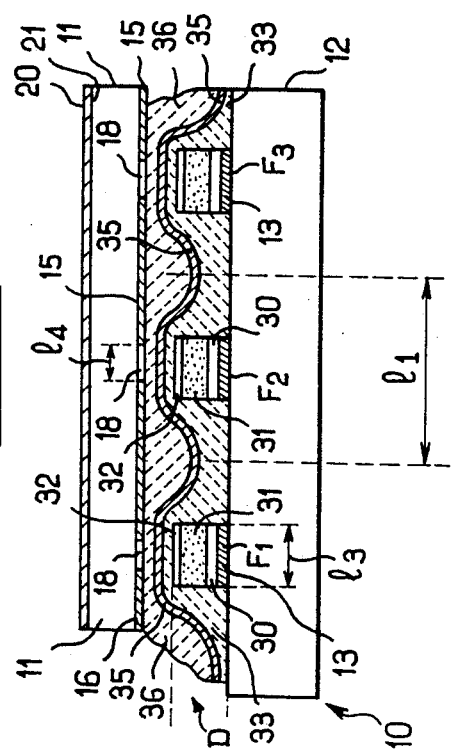
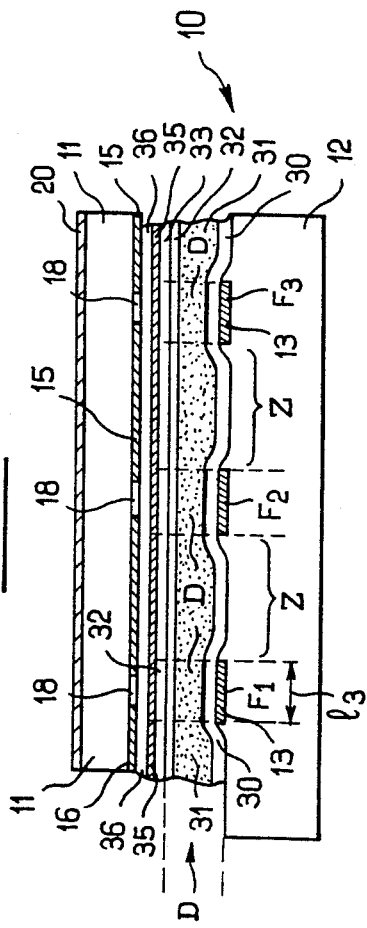

IMAGING DEVICE WITH MATRIX STRUCTURE

BACKGROUND OF THE INVENTION

1. Field of the Invention

The present invention concerns an imaging device of the type, for example, that associates a scintillator screen with a matrix of photosensitive elements, and which can be be used to convert a radiological image into electrical signals. In particular, the invention concerns means to improve the signal-to-noise ratio during the reading of signals given by the photosensitive elements.

2. Description Of The Prior Art

Conventionally, photosensitive matrices have a network of row conductors and a network of column conductors. At each intersection between a row conductor and a column conductor, there is a photosensitive assembly, hereinafter called a photosensitive dot. The photosensitive dots are thus organized both in rows and in columns. Each photosensitive dot is connected between a row conductor and a column conductor: in fact, to each row conductor there are connected as many photosensitive dots as there are columns of these dots, and to each column conductor there are connected as many photosensitive dots as there are rows of these dots.

The number of photosensitive dots in a given area determines the resolution of the image. There are known ways to make high-capacity matrices of photosensitive elements, for example with 2000×2000 photosensitive dots to obtain an image with dimensions of the order of 40 cm×40 cm. In this case, each photosensitive dot is located in an elementary zone or surface having maximum dimensions of 200 micrometers×200 micrometers.

Each photosensitive dot comprises a photosensitive element such as a photodiode, a phototransistor or a photoconductor; sensitive to visible, light photons. These light photons are converted into electrical charges and these electrical charges get accumulated in an electrical capacitor forming a storage capacitor, formed either by the capacitor of the photosensitive element itself, or by an associated ancillary capacitor. A reading device enables interrogation about the electrical state of the storage capacitor and the conveying of the electrical charge, which forms the signal, towards a signal amplifier.

An example of a photosensitive matrix is given in a French Pat. No. 86 00656, published under No. 2.579.319, which describes, in detail, the working of a photosensitive matrix as well as the appropriate reading method, each photosensitive dot of this matrix being formed by a photodiode in series with a capacitor.

Another French Pat. No. 86 00716, published under No. 2593343, relates to a matrix with a network of photosensitive dots, each formed by a photodiode and a capacitor in series, as mentioned above. This patent describes a method for the fabrication of a photosensitive matrix of this type as well as a method for the reading of this matrix and an application of this matrix to the taking of radiological images. One of the advantages of the type of structure described in this patent is that it enables the making of large matrices, which are therefore advantageously applicable to radiology, in using thin layer deposits of semiconductors, notably amorphous silicon. In this patent, in order to pick up radiological images, the structure presented has a scintillator panel or screen subjected to X-radiation. In response to this X-radiation, the scintillator screen emits a visible light radiation to which the photodiodes are sensitive.

However, one of the main problems in the reading of photosensitive dots, irrespectively of how they are made, and whether the image is a radiological or not, lies in an excessive value of the electrical capacitance displayed by the photosensitive elements. This capacitance extends its influence particularly during the reading of the photosensitive dots, namely during the amplification of the photocharge developed by a photosensitive element, subsequent to its illumination, and this capacitance of the photosensitive elements has the effect of reducing the signal-to-noise ratio.

For, taking for example, a photosensitive point with the structure described in the above-mentioned two patents: the photosensitive dot consists of a photodiode D0 placed in series with a capacitor C0. The photodiode D0 is connected to a given row conductor H0, and the capacitor C0 is connected to a given column conductor V0. All the other photosensitive dots, connected to this same column V0, form an equivalent capacitor Ceq.

The photodiode D0, which is initially reverse biased by appropriate signals applied to the row H0, is illuminated by a light flux emitted by a scintillator. By the application of a suitable electrical signal to the row H0, the potential of a dot A (which is located at the junction of the photodiode D and the capacitor C and at which the photocharge is accumulated) is restored to its initial bias level. The result thereof is the circulation, in the column V0, of an electrical reading charge q0 proportionate to the photocharge, which gives rise to a signal voltage vs at the terminals of the capacitor Ceq of this column.

It can easily be shown that this signal voltage vs is equal to: vs =q0/N.CD; where q0 represents the photocharge developed within the diode D0, N is the number of photosensitive dots arranged along the column and CD is the capacitance of the photodiode.

The signal voltage vs is amplified in an amplifier G which is either directly associated with the column V0 or else associated with several columns by means of a multiplexer device.

As mentioned above, a major characteristic is the signal-to-noise ratio S/N which is related to the capacitance CD of the photosensitive elements by the following relationship:

$$S/B = \frac{q_0}{N \cdot CD} \times \frac{1}{vb}$$

where vb is the noise voltage at the input of the amplifier.

This relationship shows that the signal-to-noise ratio S/N is optimized when the factor N.CD is minimized, namely that, for a number of photosensitive elements M arranged on a given column, the capacitance of the photosensitive element is the lowest possible.

In the most standard configuration, the capacitance of the photosensitive element, of a photodiode, for example, is related, firstly, to the thickness of the material (intrinsic silicon, thickness limited to a few micrometers) and, secondly, to the active surface or section of the photosensitive diode, which is subjected to luminous photons and is called an "active surface", said surface being demarcated, in practice, by the surfaces of the facing intersecting electrodes, namely by the surfaces of intersection between the row conductors and the column conductors.

Of course, the capacitance of the photosensitive element can be reduced by reducing its active surface, but an arrangement of this type goes against another requirement which is that, to pick up the maximum amount of light coming, for example, from a scintillator screen placed in contact with or near one of the networks of electrodes, or row or column conductors, the photosensitive element must present the maximum possible active surface with the pitches of the networks of the row conductors and column conductors. The pitches of the networks of the row conductors and column conductors divide the surface of the matrix into several elementary surfaces, each having a photosensitive dot, each elementary surface being illuminated by the light coming from a corresponding part of the scintillator, which itself represents an elementary image surface.

SUMMARY OF THE INVENTION

With the present invention, one of the goals aimed at is to improve the signal-to-noise ratio by reducing the capacitance of each of the photosensitive dots, in an image detector associating a screen or panel, notably forming a scintillator, with a matrix of photosensitive elements. This aim is achieved by a novel arrangement, particularly of the panel, which enables a far greater reduction in the active surface of a photosensitive element than in the quantity of light to which this photosensitive element is exposed. The invention, therefore, more particularly concerns a panel of this type, which may or may not be associated with a photosensitive matrix.

The invention concerns an image detector comprising a scintillator screen exposed to an incident radiation, a matrix of photosensitive dots, the matrix comprising orthogonal row conductors and column conductors, the matrix being divided into elementary surfaces, each having a photosensitive dot, the scintillator emitting a light radiation in response to the incident radiation, wherein an output screen is interposed between the scintillator and the elementary surfaces, the output screen being opaque and absorbing little of the light emitted by the scintillator, the output screen being perforated so that it comprises, facing each photosensitive dot, at least one aperture that lets through the light from the scintillator, and wherein the aperture has a smaller area than that of an elementary surface.

BRIEF DESCRIPTION OF THE DRAWINGS

The invention will be better understood from the following description, given as a non-restrictive example and made with reference to the four, appended figures, of which:

FIGS. 3a and 3b are lateral sectional drawings in two orthogonal directions, giving a schematic view of a first embodiment of an image detector according to the invention;

FIG. 4 is a lateral sectional view which schematically illustrates a second embodiment of the image detector of the invention.

DETAILED DESCRIPTION OF THE INVENTION

Figure 1:
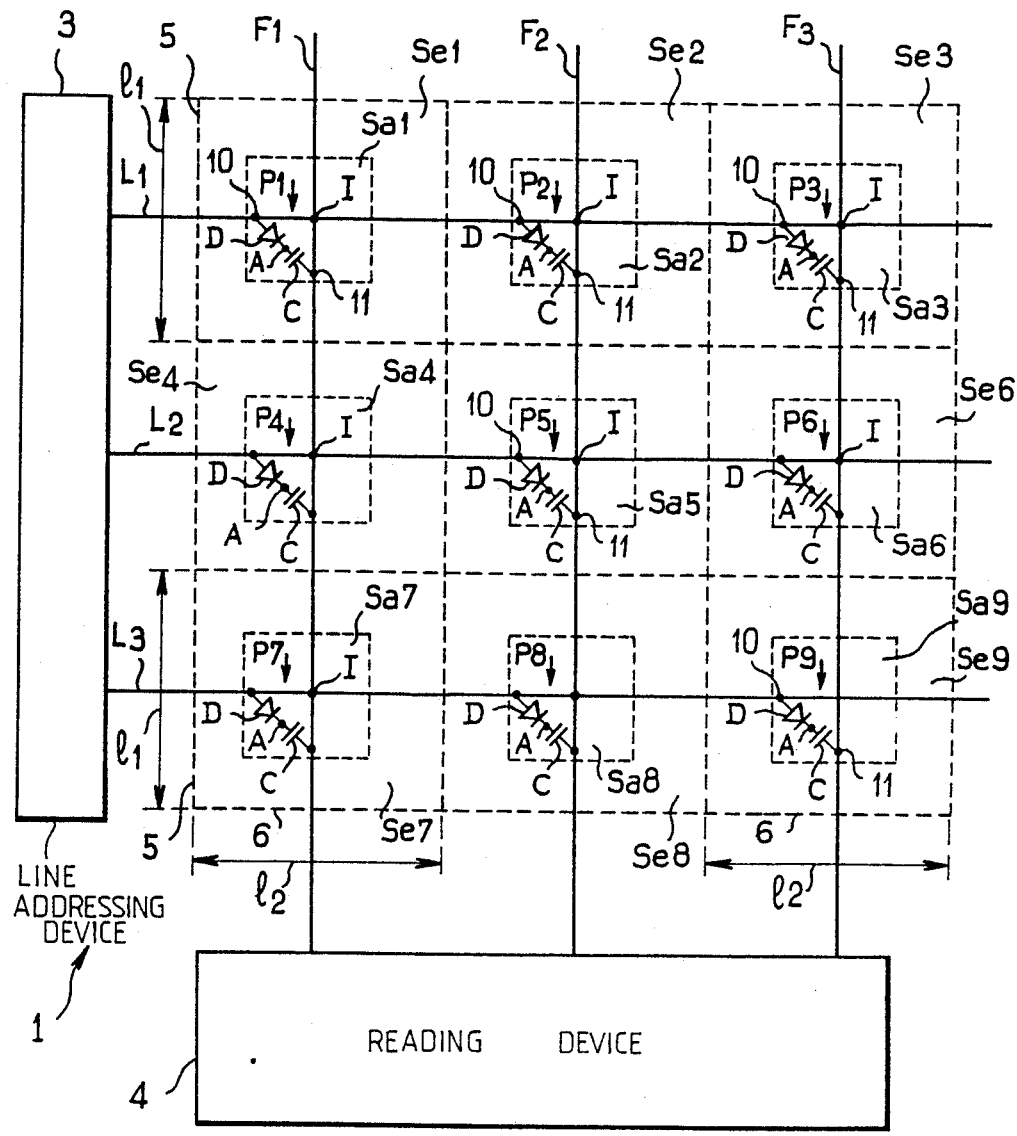
FIG. 1 shows, as a non-restrictive example, the electrical diagram of a photosensitive matrix capable of being used in an image detector according to the invention.

FIG. 1 shows the electrical diagram of a photosensitive matrix 1. This electrical diagram is a standard one in itself. For, the matrix 1 has several photosensitive dots P1, P2, . . . P9, which are arranged in rows and columns. Each of these photosensitive dots consists, in the non-restrictive example described, of a photosensitive element D in series with a capacitor C, according to a same assembly as that of the photosensitive dots described in the above-mentioned French Pat. Nos. 86 00656 and 86 00716. Of course, the invention can be applied with other types of photosensitive cells. In the non-restrictive example described, the number of photosensitive dots, P1 to P9, is restricted to nine, according to a 3×3 matrix assembly, in order to simplify FIG. 1. However, in the spirit of the invention, this matrix assembly could have a far greater capacity, for example of several millions of dots as mentioned above.

The matrix 1 has row conductors L1 to L3 and column conductors F1 to F3, the number of each type of these conductors being restricted to three in view of the example of FIG. 1, where only nine photosensitive dots are shown. In practice, and in a manner which is standard per se, the photosensitive dots P1 to P9 are each formed at the intersection of a row conductor, L1 to L3, and a column conductor, F1 to F3. Each photosensitive dot, P1 to P9, has a first end 10 connected to a row conductor, L1 to L3, and a second end 11, connected to a column conductor, F1 to F3. The junction formed between the photosensitive element D and the capacitor C forms a zone A where charges are generated and stored in a quantity proportionate to the illumination of the photosensitive element. In the non-restrictive example described, the photosensitive element D is a photodiode, but it could be of a different type. It could be a phototransistor, notably of a NIPIN or PINIP type.

The row conductors L1 to L3 are connected to a row addressing device 3, and the column conductors F1 to F3 are connected to a reading and multiplexing device 4 in such a way as to implement either of the methods taught in the French patent applications Nos. 86 00656 and 86 00716, with a view, initially, to enabling the creation and storage of charges or pieces of information at the different points A and, secondly, to enabling the reading and acquisition of these pieces of information. It may be recalled that, for each photosensitive dot P1 to P9, the following are the main stages:

(1) stage for the reverse biasing of the diode;

(2) photodiode illumination stage (subsequent, for example, to a flash of X-radiation for the irradiation of a patient, and conversion of X-radiation into a radiation of visible or near-visible length); storage of information corresponding to the illumination;

(3) reading stage (forward biasing of the diode);

(4) stage for resetting of the voltages at the terminals of the photodiode, obtained either by means of an electrical biasing pulse applied to the row conductors or by means of a calibrated, uniform illumination, or by means of an intense light flash.

As mentioned in the introduction, the matrix 1 is divided into elementary surfaces Se1, Se2, . . . Se9, each centered on a center of intersection I between a row conductor L1 to L3 and a column conductor F1 to F3, and each comprising a photosensitive dot P1 to P9. The elementary surfaces Se1 to Se9 have dimensions determined by the pitches of the networks of row and column conductors L1 to L3 and F1 to F3, which are respectively symbolized by a first length and a second length 11, 12 of a first side and a second side 5, 6, of the elementary surfaces Se1 to Se9. If the pitches are the same, the elementary surfaces Se1 to Se9 are square shaped, as in the non-restrictive example described. Thus, in the case of large-capacity matrices (with several millions of dots), the length 11, 12 of a side 5, 6, may be 200 micrometers.

In the prior art, the standard configuration consists in giving the photosensitive dots an active surface (formed by the surface of a photosensitive element) which is as big as possible, in order to pick up the maximum amount of light coming, for example, from a scintillator screen (not shown in FIG. 1): since the scintillator screen is, for example, in a plane that is parallel to that of the FIG., it is exposed to X-rays (not shown) having a mean direction perpendicular to the plane of the figure and, in response 25 to the X-rays, the scintillator screen emits light rays which are absorbed by the photosensitive elements. Thus, in the most usual prior art cases, the active surface of the photosensitive dots tends to have one and the same area as the elementary surfaces, albeit a little smaller in order to avoid shortcircuits between adjacent photosensitive dots, so that each photosensitive element has a high capacitance of its own.

With the present invention, on the contrary, the photosensitive dots, P1 to P9, may have an active surface, Sa1, Sa2, ..., Sa9, which is far smaller than that of the elementary surfaces Se1 to Se9, without damaging sensitivity, so as to increase the signal-to-noise ratio. In the non-restrictive example shown in FIG. 1, the active surfaces Sa1 to Sa9 are shown as being centered on an intersection I. However, in the spirit of the invention, these active surfaces and, consequently, the photosensitive elements D, may not be arranged so as to be centered on these intersections.

Figure 2:
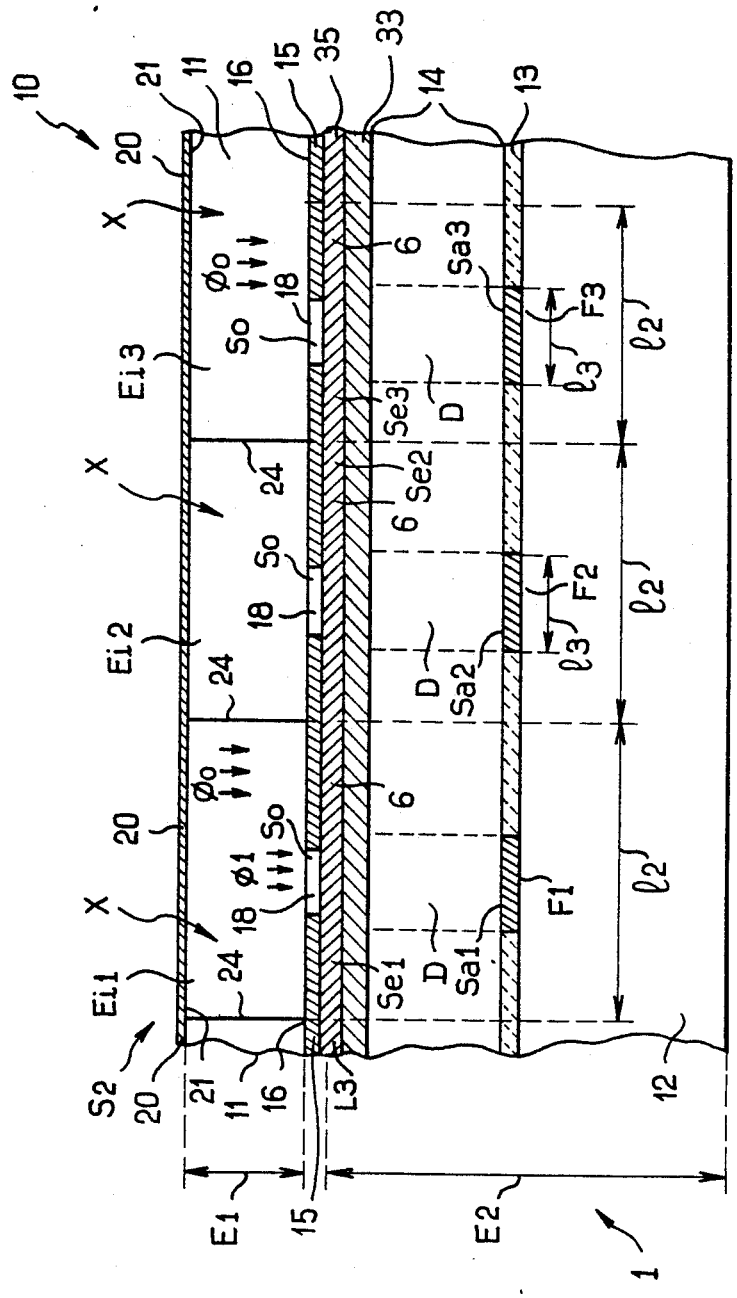
FIG. 2 shows a schematic view of an image detector according to the invention, and illustrates its operating principle.

FIG. 2 gives a schematic view, as a non-restrictive example, of an image detector device 10 according to the invention.

The image detector 10 uses a scintillator screen 11 and a photosensitive matrix structure 1, the electrical diagram of which is, for example, the one shown in figure 1. The scintillator screen 11 and the photosensitive matrix 1 are placed one on top of the other, in planes that are perpendicular to that of FIG. 2, and are seen along their respective thicknesses E1, E2.

Assuming that the scintillator screen 11 is designed to convert an incident X-radiation into visible light photons, it may have a thickness E1 of the order of 100 to 400 micrometers, for example, and may consist of standard materials such as those commonly used to manufacture radiology screens, namely materials like calcium tungstate, gadollium oxysulphide, alkali halide such as cesium iodide, etc.

The photosensitive matrix 1 is formed by a structure, which is further explained in a subsequent part of the description made with reference to FIGS. 3a, 3b. This structure is obtained by the successive deposition, on a substrate 12, of an electrically conductive layer 13, followed by a stacking 14 of several semiconducting layers, a stacking on which is deposited a dielectrical layer 33 which is transparent to light.

On top of the dielectrical layer 33, there is deposited an electrically conductive layer 35 designed to form a network of electrodes, a network of row conductors L1 to L3, for example. This entire unit is covered with the scintillator screen 11. In the non-restrictive example described, the first conductive layer 13, located towards the substrate 12, is etched so as to form the column electrodes or column conductors F1, F2, F3 which extend in a plane perpendicular to that of the figure, and the upper conductive layer 35, located towards the scintillator 11, is also etched to form row electrodes or row conductors L1, L2, L3, which extend parallel to the plane of FIG. 2 and of which only one row conductor, L3 for example, appears in FIG. 2.

As mentioned earlier, the area of the matrix 1 is divided into elementary surfaces Se1 to Se9 which are seen, in FIG. 2, by the length 12 of their side 6 parallel to the row conductors L1 to L3. The surface S2 of the scintillator screen 11 may also be considered to be divided into elementary images Ei1, Ei2, . . . Ei9 facing elementary surfaces Se1 to Se9 and having one and the same area as the latter.

Since the scintillator 11 is exposed to X-rays, it provides locally, in each of the volumes corresponding to an elementary image Ei1 to Ei9, for the conversion of the incident X-radiation into visible light photons $\phi 0$ (not shown) which are emitted towards the elementary surface Se1 to Se9.

According to one characteristic of the invention, an output screen 15, which is opaque to the light emitted by the scintillator 11, is placed between this scintillator 11 and the matrix 1. More precisely, the output screen 15 is applied to the scintillator 11 against an output face 16 of this scintillator, pointed towards the matrix 1. The output screen 15 comprises, facing each elementary surface Se1 to Se9, at least one aperture or hole 18. These apertures 18 enable the light emitted by the scintillator to go towards the elementary surfaces Se1 to Se9, namely towards the photosensitive elements. The function of the output screen 15 is to send back, towards the inside of the scintillator 11, (and therefore, to absorb the smallest possible quantity of) those photons which are oriented to leave the scintillator through the output face 16 of this scintillator, outside the designed zones of passage formed by the apertures 18. The scintillator 11 further has a second screen 20, placed on an input face 21 opposite the output face 16. The function of this second screen 20 is to reflect or diffuse the photons towards the output face 16.

In this configuration, although the apertures or output holes 18 have an area So which is far smaller than the area of an image element Ei1 to Ei9 and through which the flux of photons $\phi 0$ would leave the scintillator if the first screen or output screen 15 were to be absent, it is observed that the flux of photons $\phi 1$ leaving by a hole 18 may be of the same magnitude as the flux $\phi 0$ which would exist if there were no first screen 15. We think that this effect, which is surprising at first sight, can be explained by the fact that the photons which encounter the output screen 15 undergo multiple reflections and diffusions until they are on a trajectory that passes through the output hole 18. The flux (not shown) emitted laterally, i.e. parallel to the input and output faces 21, 16, of the scintillator 11, is compensated for by an equivalent flux coming from the contiguous image elements Ei1 to Ei9. In fact, each image element, Ei may be considered to have five walls, one of which is formed by the second screen or input screen 20, the other four walls being formed by the border zones shared with the neighbouring image elements Ei. Walls 24, such as these, separating contiguous image elements Ei in the planes perpendicular to that of FIG. 2, are shown in this figure.

This screen 15, as well as the input screen 21, may be made of a metal with a high reflection coefficient for the light emitted by the scintillator. It may be made of aluminium, for example, or chromium or, again, a diffusing material with a high albedo, such as magnesium for example.

Thus, for the first screen 15, or output screen, as well as for the second screen 20, or input screen, we define the term 'opaque screen' to mean a screen which is opaque to the light generated in the scintillator, and does not absorb this light or absorbs little of it, in such a way as to send it back into the scintillator by reflection or diffusion, namely an opaque screen with a high albedo.

The presence of the perforated output screen 15 and of the input screen 20 tends to create, in the scintillator 11, the equivalent of a matrix network of optical concentrators of light energy (light energy created inside the scintillator), these optical concentrators being made up of cavities or pseudo-cavities with high optical efficiency, formed so as to face each image element Ei1 to Ei9 and, consequently, indexed on the network of the elementary surface Se1 to Se9 of the matrix 1 and, particularly, of the photosensitive elements.

The area So of the output holes 18 is far smaller than that of the image elements Ei1 to Ei9 and of the elementary surfaces Se1 to Se9, so that it is enough for the area of the active surface Sa1 to Sa9 of a photosensitive element to be equal or slightly greater than the area So of an output hole 18 to pick up all the light emitted by an image element EI of the scintillator 11.

In the non-restrictive example shown in FIG. 2, the photosensitive diodes D are formed in the stacking 14 of semiconducting layers and are demarcated by the intersection surface between the column conductors F1 to F3 and the row conductors L1 to L3 (of which only the third conductor N3 is visible along its length in FIG. 2). This intersection surface forms the active surface Sa of the photosensitive elements D, and is shown in FIG. 2 by a width 13 of the column conductors F1 to F3. If the row conductors L1 to L3 have the same width (not shown in FIG. 2) as the width 13 of the column conductors F1 to F3, the active surface Sa of a photosensitive element is shaped like a square, of which the side (namely the width 13 of a column conductor) may be, for example, between 20 and 50 micrometers, and may thus define photosensitive elements D with an active surface Sa1 to Sa9 which is far smaller than the elementary surfaces Se1 to Se9.

In the prior art, to pick up the maximum amount of light, the area of the active surface of a photosensitive element is equal to or somewhat smaller than that of the elementary surface Se1 to Se9, namely about 40,000 micrometers$^2$ if the length 11, 12 of an elementary surface Se1 to Se9 is 200 micrometers. In the image detector according to the invention, a photosensitive element D, the active surface Sa1 to Sa9 of which has a side corresponding to the width 13, for example a width of 50 micrometers, picks up the maximum amount of light with an active surface Sa1 to Sa9 which is at least 15 times smaller than in the prior art: the result of this is that, in this case, in the image detector of the invention, a photosensitive element D has a capacitance at least 15 times smaller than in the prior art. It is observed that this is a considerable improvement because an already very satisfactory improvement would be obtained if the active surface Sa were to be, for example, half of the elementary surface Se. It is observed that a structure where the photosensitive element D has an active surface Sa which is small in comparison with the elementary surface Se not only reduces the capacitance but also reduces the dark current which may be considered to be a disturbing noise.

It must be noted that, in the non-restrictive example shown in FIG. 2, the scintillator 11 is practically in contact with or in the immediate vicinity of the matrix 1. However, within the spirit of the invention, the scintillator 11 may also be in the not immediate vicinity of the matrix 1 of photosensitive element. The light leaving the output holes 18 may then be transferred by light conduits forming optic fibers, which are standard per se , made of glass, for example, or plastic, and which have low absorption, are non-reducing and have an optical transfer efficiency of nearly one.

It must be further noted, that, firstly, a scintillator formed by a panel having a same arrangement as the scintillator 11 so as to form the equivalent of a matrix network of optical concentrators as explained above, can be advantageously used without being associated with a photosensitive matrix as in the above example. Furthermore, an arrangement of this type can also apply to a panel or screen which is not formed by a scintillating substance:

(a) a scintillator panel thus arranged, exposed to incident radiation (X-rays for example) can be observed directly with the eye. The light flux leaving a pseudo-cavity is of the same order as the light flux emitted in the panel when there is no perforated output screen 15; the result thereof is greater local luminance (for equal fluxes, the luminances are in the ratio of the area of the elementary image surface EI to the area So of the output hole 18);

(b) the panel may be coupled, by optical contact, to a photographic film, for example of the type commonly used in radiography. This film may have a non-linear darkening characteristic (gamma 1 to 4); the result thereof may be a darkening (a local darkening at the output holes 18) which is greater than with a standard scintillator screen or panel. The result thereof is a high gain in the radiation dose for perform the radiography. It may be necessary to observe the film after development through an opaque and perforated mask according to a distribution identical to that of the output holes 18;

(c) The panel or screen may be of the type with "projection by the rear face", used in television. In this case, the panel is made not of fluorescent material under the excitation of an X-radiation, but of a material which is transparent or weakly diffusive for the light projected on the face opposite to the one which is observed; this panel then comprises only the perforated, output screen 15.

FIGS. 3a and 3b show lateral sections along two orthogonal directions which show, as a non-restrictive example and in a schematic way, a first embodiment of an image detector according to the invention.

The image detector comprises the substrate 12, made of glass, for example, which may or may not be transparent. A layer 13 of an electrically conductive material is deposited on the substrate 12. This layer 13 of electrically conductive material is formed, for example, by indium-tin oxide (ITO). This layer 13 is etched so as to form the column conductors F1, F2, F3, at a pitch of 200 micrometers, for example, and has a width 13 of 50 micrometers, for example. Then there are the photosensitive elements D, each photosensitive element being formed, for example, by a PIN diode (PN junction with intrinsic central part). The diodes D are formed by the deposition, on the column conductors, of three successive layers 30, 31, 32.

This layer 30 is a layer of hydrogenated amorphous silicon, doped with a P type impurity, boron for example. The second layer 31 is a layer of intrinsic hydrogenated amorphous silicon. The third layer 32 is a layer of hydrogenated amorphous silicon with an N type impurity, phosphorous for example. These last three layers 30, 31, 32, are etched with a pattern of islets so as to form the photosensitive elements or diodes D. The islets have the shape of a square, the sides of which have the same size as the width 13 of the column conductors F1 to F3. This width 13 of the column conductors is itself far smaller than the size 11 of one side of an elementary surface SE1 to SE9. Above this third layer 32, belonging to the photodiodes d, there is an insulating layer 33 designed to form the dielectric of the capacitors C (shown in FIG. 1) which are in series with the photosensitive elements D. The dielectric layer 33 is transparent, being made, for example, of silicon nitride.

The dielectric layer 33 is coated with an upper conductive layer 35 which is also transparent (made of indium-tin oxide for example) and which is etched to form the row conductors L1 to L3. In the non-restrictive example of the invention, the row conductors L1 to L3 have one and the same width as the column conductors F1 to F3.

Above the upper conductive layer 35, from which the row conductors are formed, there is placed a layer 11 of a scintillating substance, gadolinium oxysulphide for example, which emits a visible light in response to an incident X-radiation. Thus, for example, the scintillating layer 11 may be formed by a gadolinium oxysulphide powder embedded in a thermohardening resin, so as to form a foil with a thickness of 100 to 400 micrometrs.

As explained with reference to FIG. 2, the scintillating layer or scintillator 11 has an output face 16, against which is applied the output screen 15 having output holes 18. To this end, in the non-restrictive example of the description, a transparent layer 36 of an insulating material is deposited on the row conductors L1 to L3, notably to set up an insulating layer on top of these conductors and to form a substantially plane surface 37. The output screen 15 is formed, for example, by an aluminium layer deposited on the plane surface 37. The aluminium layer 15 is then etched so as to form the output orifices 18 having, for example, a square section, the sides of which have a length 14 (of 40 microns for example) which is equal to or smaller than the length 13 of the column conductors and row conductors F1 to F3 and L1 to L3. The foil forming the scintillator 11 is bonded to the output screen 15. Of course, the aluminium layer, designed to form this output screen 15, can also be deposited directly on the output face 16 of the scintillator 11. The input screen or second screen 20 is, for example, also made of aluminium, in a layer which is deposited on the input face 21 of the scintillator 11.

The embodiment shown in FIGS. 3a, 3b, is given as a non-restrictive example and, notably, the layers 30, 31, 32, 33, with which the photodiodes D and the capacitors C are formed, can be arranged in different orders, so as to form, for example, PIN type as well as NIP type photodiodes, or so as to modify the positions between the photodiode and the capacitor with reference to the row and column connectors. The photosensitive elements may also have different natures: for example, they may be phototransistors. The essential point is that the flux of photons has to be concentrated at each photosensitive element, by means of a perforated reflector, according to the principle behind the output screen 15, so as to enable a reduction in the active surface Sa of the photosensitive elements D and, consequently, reduce the capacitance presented by each of these photosensitive elements.

FIG. 4 illustrates a second version of the image detector according to the invention, wherein the three semiconducting layers 30, 31, 32, from which the photodiodes D are formed, are not etched.

For, in the example described with reference to FIGS. 3a and 3b, the silicon layers 30, 31, 32 are etched in the form of islets by chemical etching, for example, or by dry etching under plasma. The cost of this etching operation is not negligible.

The embodiment shown in FIG. 4 is similar to that of FIG. 3a, except that the operation for etching the amorphous silicon islets, after the deposition of the three successive layers 30, 31, 32, is not performed.

During operation, following the powering of the row conductors and column conductors L1 to L3 and F1 to F3, an electrical field (not shown) is created between each of these types of conductors on a surface which corresponds to the surface of their intersection, and outside this surface (shown in FIG. 4 by the width 13 of the column conductors F1 to F3), the semiconducting layers 30, 31, 32 are subjected to a negligible electrical field. Thus, between adjacent photodiodes D, there are zones Z which are not subjected to a notable electrical field.

Consequently, these zones Z have very high resistance which prevent any electrical leakage between the photodiodes. This property is due to numerous traps in the photosensitive semiconducting material used, notably amorphous silicon which, in the absence of any notable electrical field, results in very low mobility of the electrical carriers and, consequently, an absence of conductivity. It must be noted that the photosensitive semiconducting material that can be used is not only hydrogenated amorphous silicon. Other materials can be used such as, notably, selenium, lead oxide deposited in amorphous or polycrystalline form, etc. It must be noted that these materials are used to make the PIN type photosensitive layers of television tubes, with thicknesses comparable to those used herein, namely of about 0.5 to a few micrometers.

It must be further noted that, in the description, it is assumed that the invention applies to the detection of X-ray pictures, notably in medical radiology, but it can also apply to the detection of other radiations provided that there are scintillating substances available to perform the desired wavelength conversions.

What is claimed is:

1. An image detector comprising a scintillator exposed to an incident radiation, a matrix of photosensitive dots, the matrix comprising orthogonal row conductors and column conductors, the matrix being divided into elementary surfaces, each having a photosensitive dot, the scintillator emitting a light radiation in response to the incident radiation, wherein an output screen is interposed between the scintillator and the elementary surfaces, the output screen being opaque and absorbing little of the light emitted by the scintillator, the output screen being perforated so that it comprises, facing each photosensitive dot, at least one aperture that lets through the light from the scintillator, and wherein the aperture has a far smaller area than that of an elementary surface, and wherein a second non-perforated screen is placed on an input face of the scintillator opposite to the elementary surfaces, the second screen being opaque and absorbing little of the light emitted by the scintillator.

2. An image detector according to claim 1, wherein the photosensitive dots have an active surface which is far smaller than an elementary surface.

3. An image detector according to claim 2, wherein the photosensitive dots have an active surface which is equal to or smaller than half of an elementary surface.

4. An image detector according to claim 2, wherein the apertures have a surface which is equal to or smaller than an active surface.

5. An image detector according to claim 1, wherein the output screen is applied against an output face of the scintillator, pointed towards the elementary surfaces.

6. An image detector according to claim 1, wherein at least one of the two screens is reflective.

7. An image detector according to claim 1, wherein at least one of the two screens is diffusive.

8. An image detector according to claim 1, wherein the photosensitive dots comprise at least one photosensitive element, the photosensitive elements being formed by means of a stacking of semiconducting layers located between a plane containing the row conductors and a plane containing the column conductors, wherein the row conductors and column conductors have a width which is smaller than the dimensions of an elementary surface.

9. An image detector according to claim 8, wherein the photosensitive elements are demarcated by the etching of semiconductive layers.

10. An image detector according to claim 9, wherein the photosensitive elements are substantially demarcated by an intersection surface formed at the intersection of a row conductor and a column conductor, the semiconducting layers not being etched.

11. An image detector according to claim 1, wherein the incident radiation is an X-radiation.

12. An image detector comprising a panel exposed to an incident radiation, the panel comprising an input face exposed to the incident radiation and an output face through which a light radiation leaves, wherein the output face has an output screen which is reflective for the light leaving the panel, the output screen being perforated so as to have apertures placed in a matrix arrangement, and wherein the input face has an input screen which is reflective for the light leaving the panel.

13. An image detector according to claim 12, wherein the panel is formed by at least one scintillating substance.

14. An image detector according to claim 11, wherein the incident radiation is an X-radiation.

* * * * *